United States Patent
Kim et al.

(10) Patent No.: US 8,181,597 B2
(45) Date of Patent: May 22, 2012

(54) PLASMA GENERATING APPARATUS HAVING ANTENNA WITH IMPEDANCE CONTROLLER

(75) Inventors: Hong-Seub Kim, Yongin-si (KR); Hyeon-Dong Shin, Hwaseong-si (KR)

(73) Assignee: Jehara Corporation, Suwon-Si Gyeonggi-Do (KR)

( * ) Notice: Subject to any disclaimer, the term of this patent is extended or adjusted under 35 U.S.C. 154(b) by 300 days.

(21) Appl. No.: 12/599,799

(22) PCT Filed: Apr. 18, 2008

(86) PCT No.: PCT/KR2008/002196
§ 371 (c)(1),
(2), (4) Date: Nov. 11, 2009

(87) PCT Pub. No.: WO2008/143405
PCT Pub. Date: Nov. 27, 2008

(65) Prior Publication Data
US 2010/0237777 A1    Sep. 23, 2010

(30) Foreign Application Priority Data
May 23, 2007 (KR) .................. 10-2007-0050013

(51) Int. Cl.
*H01L 21/3065* (2006.01)
*C23C 16/00* (2006.01)

(52) U.S. Cl. ............. 118/723 I; 156/345.48; 216/67
(58) Field of Classification Search ............. 118/723 I, 118/723 R; 156/345.48, 345.53; 216/67, 216/68; 313/607
See application file for complete search history.

(56) References Cited

U.S. PATENT DOCUMENTS

| | | | |
|---|---|---|---|
| 6,422,172 B1 * | 7/2002 | Tanaka et al. | 118/723 R |
| 2005/0082005 A1 * | 4/2005 | Okumura et al. | 156/345.47 |
| 2008/0168945 A1 * | 7/2008 | Kim | 118/723 I |

FOREIGN PATENT DOCUMENTS

| | | |
|---|---|---|
| JP | 10-172792 | 6/1998 |
| JP | 2006-216605 | 8/2006 |
| KR | 10-2005-0007624 | 1/2005 |
| KR | 10-2005-0011349 | 1/2005 |
| KR | 10-2006-0024690 | 3/2006 |

* cited by examiner

*Primary Examiner* — Karabi Guharay
(74) *Attorney, Agent, or Firm* — IPLA P.A.; James E. Bame

(57) ABSTRACT

Provided is a plasma generating apparatus. The apparatus includes a vacuum chamber, an ElectroStatic Chuck (ESC), an antenna holder. The vacuum chamber has a hollow interior and is sealed at its top by a vacuum plate that has a through-hole at its center. The ESC is disposed at an internal center of the vacuum chamber. The antenna unit is disposed within the vacuum chamber under the vacuum plate. The antenna cover covers and is coupled to a top of the antenna unit and receives and forwards an external source RF to the antenna unit. The cover holder is caught by an upper surface of the vacuum plate and suspends and holds the antenna unit.

8 Claims, 7 Drawing Sheets

[Fig. 1]
Prior Art
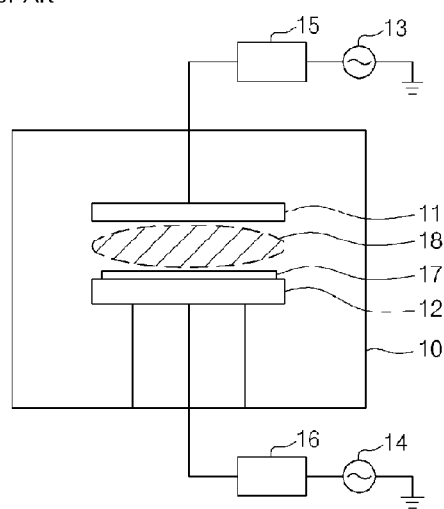
[Fig. 2]
Prior Art
A
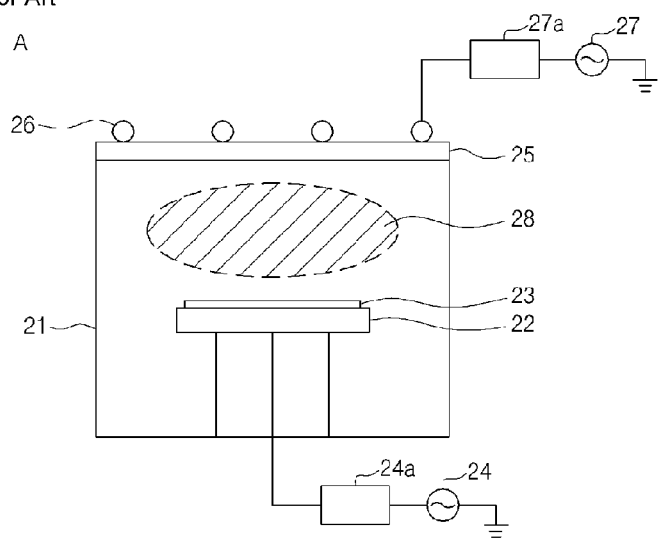
B
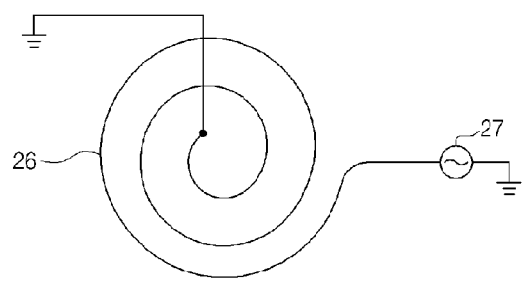

[Fig. 3]
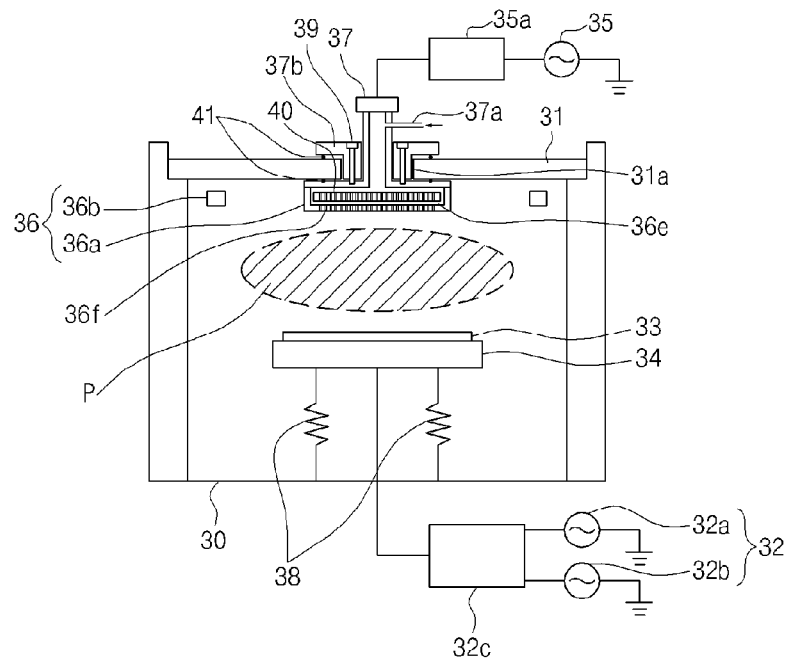
[Fig. 4]
A
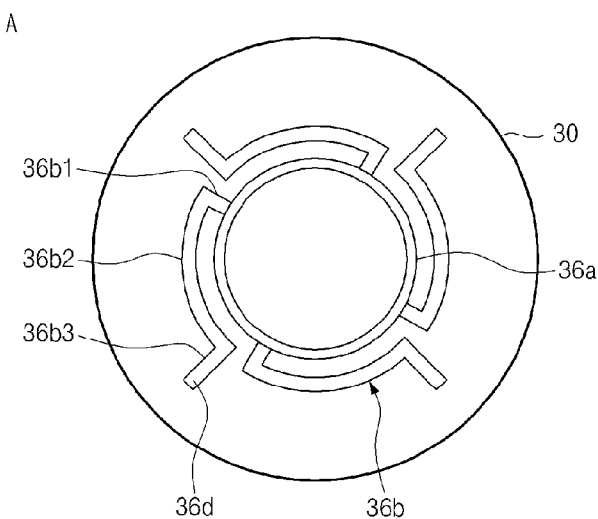
B
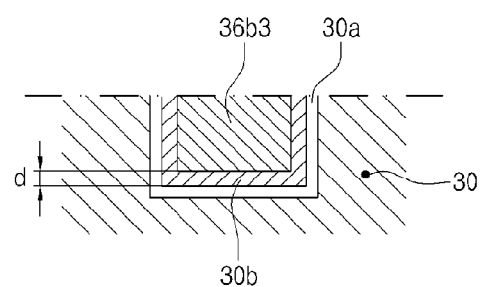

[Fig. 5]
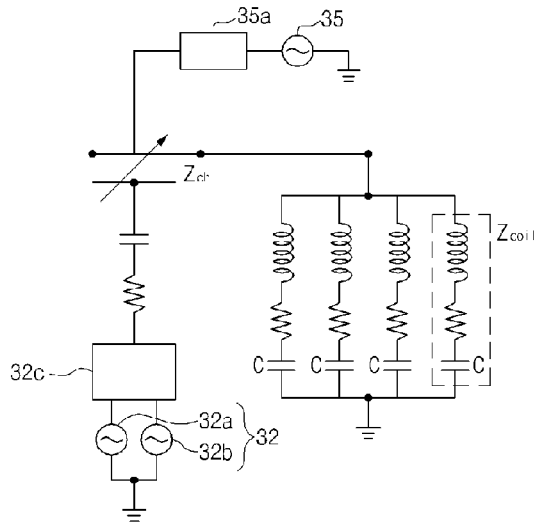
[Fig. 6]
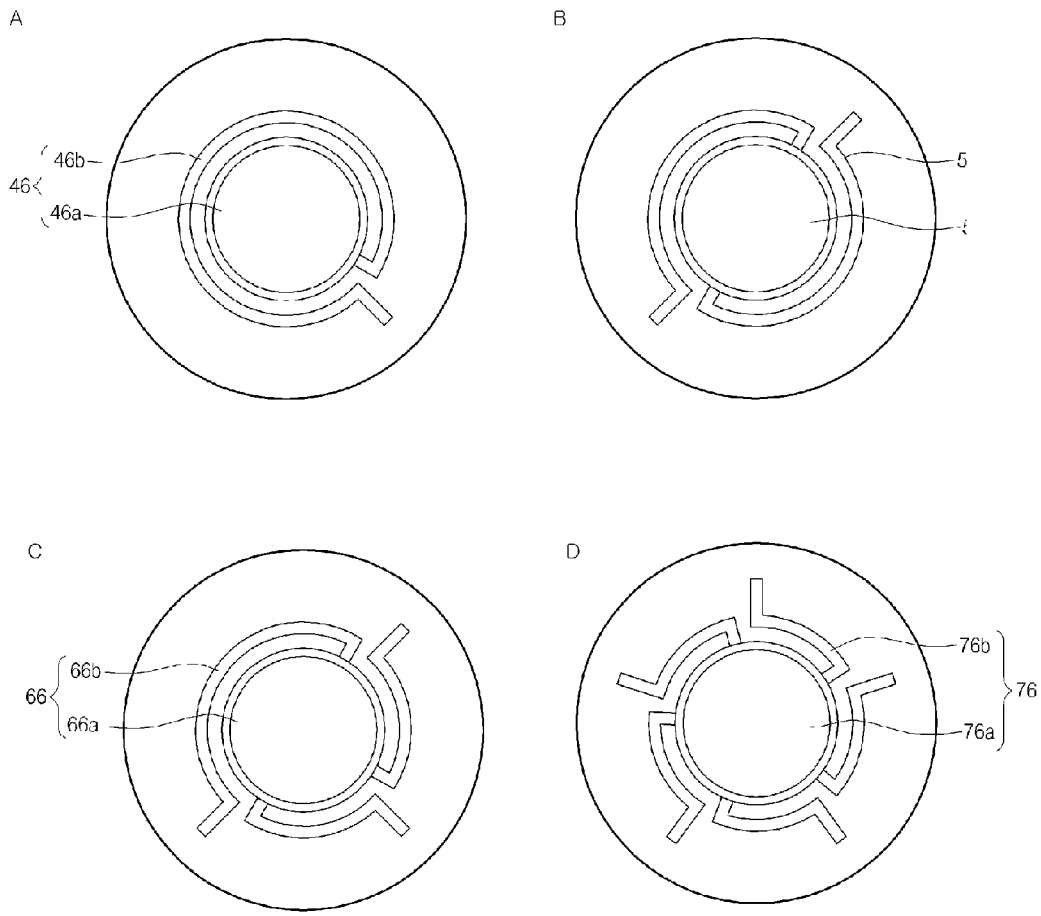

[Fig. 7]
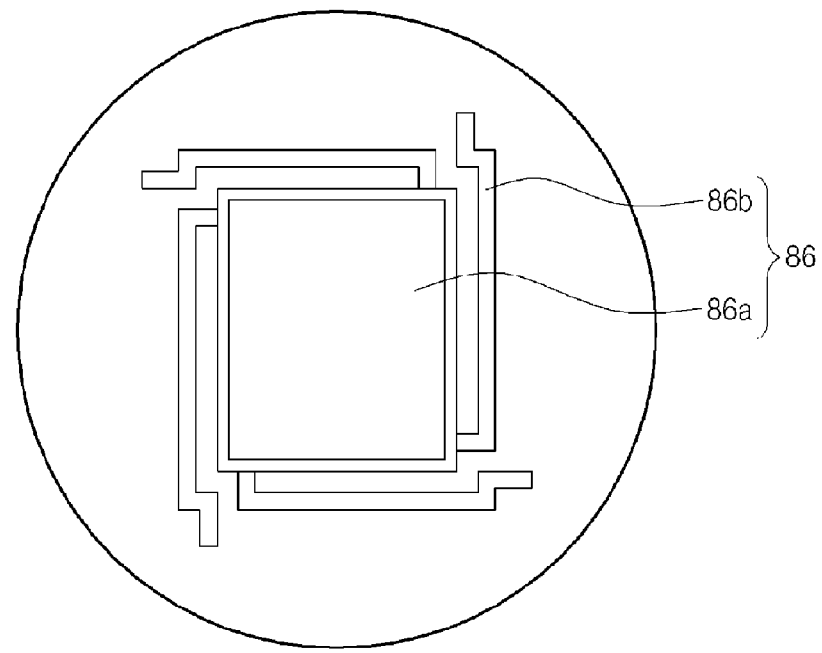
[Fig. 8]
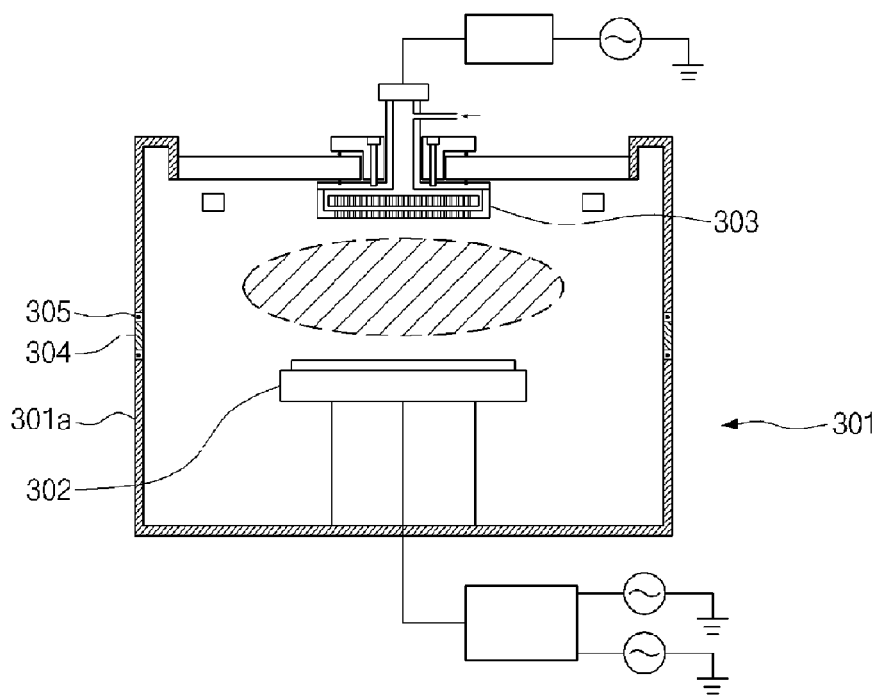

[Fig. 9]
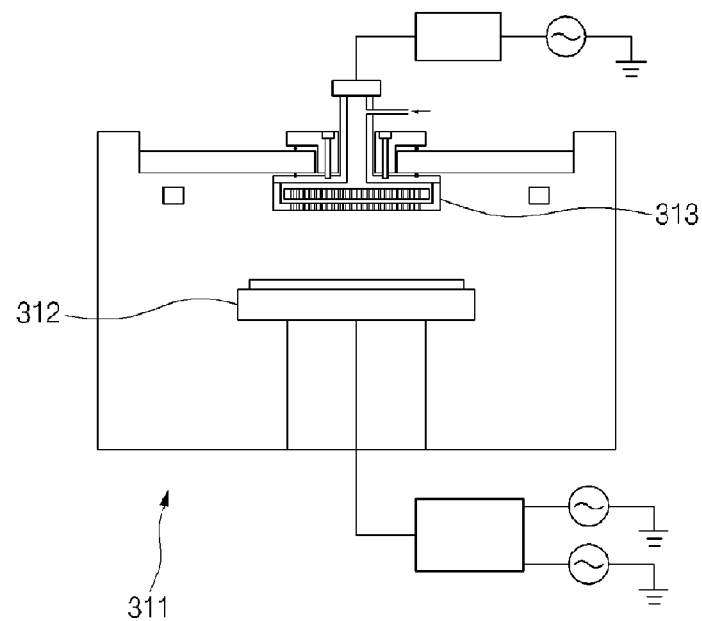
[Fig. 10]
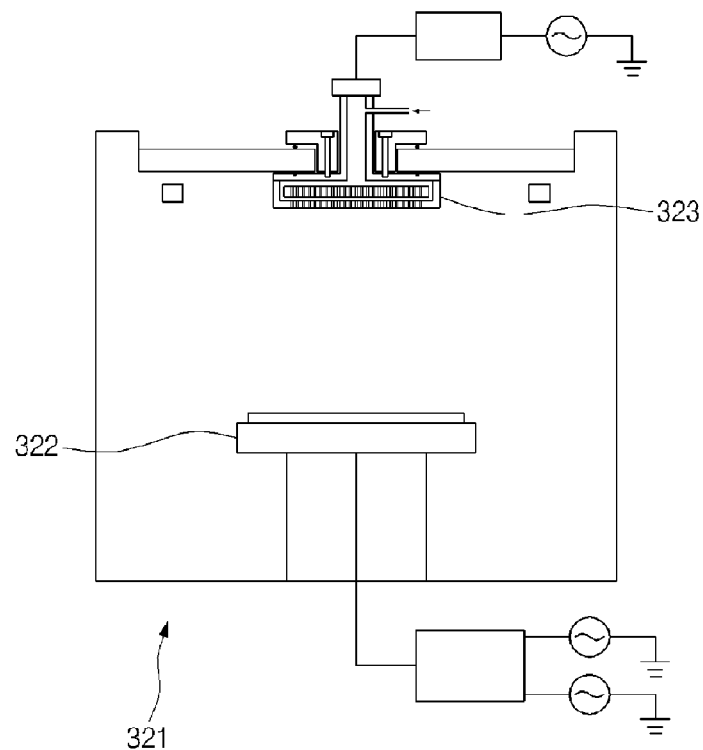

[Fig. 11]
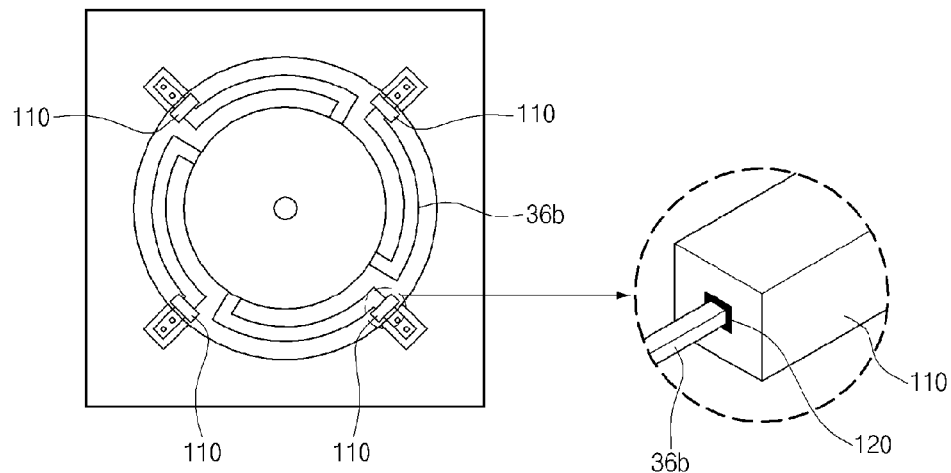
[Fig. 12]
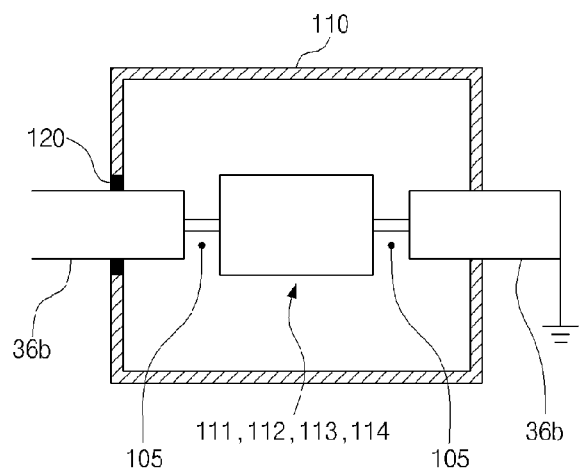
[Fig. 13]
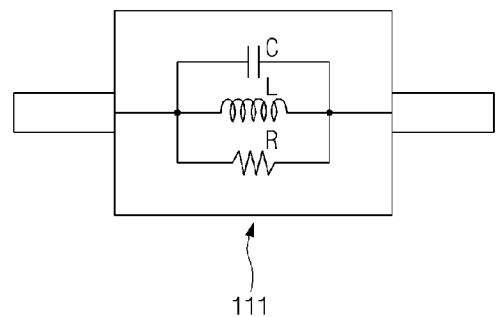

[Fig. 14]
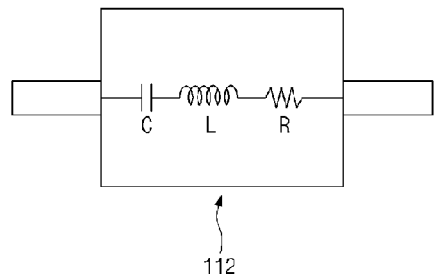
[Fig. 15]
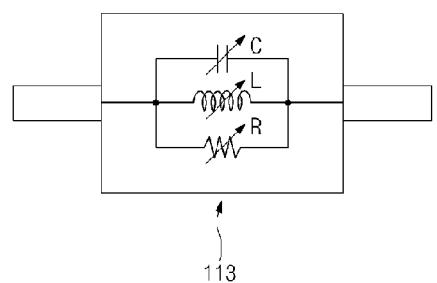
[Fig. 16]
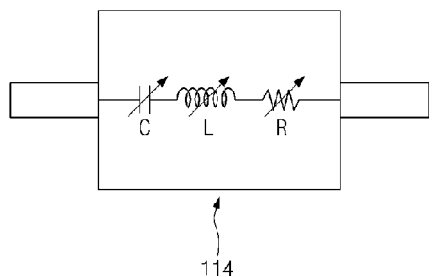
[Fig. 17]
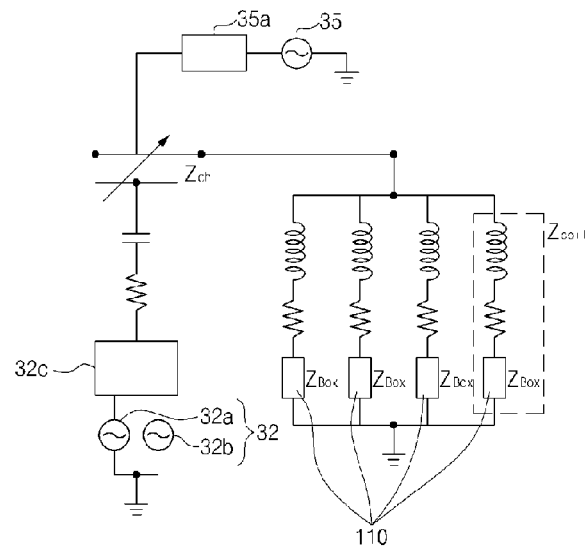

PLASMA GENERATING APPARATUS HAVING ANTENNA WITH IMPEDANCE CONTROLLER

TECHNICAL FIELD

The present invention relates to a plasma generating apparatus. More particularly, the present invention relates to a plasma generating apparatus configured to install an antenna unit having a complex structure of a plate shape antenna and a coil shape antenna within a chamber, allow elevation and descending of an ElectroStatic Chuck (ESC), control capacitance between the ESC and the antenna unit, selectively form either an electric field or a magnetic field within the chamber, and control RF power efficiency maximization and transmission rates, thereby being capable of increasing a density of plasma compared to a conventional high-density plasma generating apparatus, generating uniform plasma in both conditions of narrow and wide gaps between the ESC and the antenna unit and even in both conditions of low and high pressures within the vacuum chamber at the time large-scale high-density plasma is formed, applying to a diversity of processes for a semiconductor, a Liquid Crystal Display (LCD), an Organic Light Emitting Diode (OLED), a solar cell, etc. and also applying to material processing using plasma such as etching, Chemical Vapor Deposition (CVD), plasma doping, and plasma cleaning.

BACKGROUND ART

In general, plasma, an ionized gas, is the fourth state of matter that is not solid, liquid, and gas. Free electrons, positive ions, neutral atoms, and neutral molecules coexist and incessantly interact with each other in plasma. The control of each component and concentration is of significance. In engineering aspects, plasma is regarded as gas that can be formed and controlled by an external electric field.

A conventional plasma generating apparatus is described below.

As shown in FIG. 1, a conventional plasma generating apparatus is configured to generate plasma 18 by installing two plate electrodes that are a source electrode 11 and an ESC (or a susceptor) 12 such that they are spaced a predetermined distance apart up/down within a vacuum chamber 10, then placing a substrate 17 on a top surface of the ESC 12, and then applying an external Radio Frequency (RF) and forming a strong electric field between the source electrode 11 and the ESC 12.

Non-described reference numerals 13, 14, 15, and 16 denote a source RF, a bias RF, a source matcher, and a bias matcher, respectively.

In the conventional, so-called Capacitively Coupled Plasma (CCP) type plasma generating apparatus, uniform plasma can be generated even for a large-scale target by using a plate capacitor.

However, in the CCP type plasma generating apparatus, a density of plasma generated is low and, particularly, there is a disadvantage that it is difficult to generate and maintain plasma at a low pressure of 10 mTorr (mT) or less despite the fact that there is a demand for a low pressure process of 10 mT or less due to the recent mini-authorization in a semiconductor process and a Liquid Crystal Display (LCD) process.

Also, there is a disadvantage in that the low plasma density leads to a reduction of an etch rate and a deposition rate, thus deteriorating productivity.

As shown in FIG. 2, a conventional plasma generating apparatus is configured to generate plasma 28 by placing a substrate 23 on a top surface of an ESC (or a susceptor) 22 within a vacuum chamber 21, applying a bias RF 24, applying a source RF 27 to an antenna 26 that is disposed on a top surface of a ceramic vacuum plate 25 that covers a top surface of the vacuum chamber 21, inducing a flow of electric current, applying a magnetic field to the interior of the vacuum chamber 21, forming an inductive electric field by the applied magnetic field, and accelerating electrons by the inductive electric field.

Non-described reference numerals 24a and 27a denote a bias matcher and a source matcher, respectively.

In the conventional, so-called Inductively Coupled Plasma (ICP) type plasma generating apparatus, plasma can be advantageously generated at high density compared to the CCP type and also, high-density plasma can be generated even at a low pressure of 10 mT or less at which the CCP type could not do so. Thus, the ICP type has been widely used in a semiconductor process needing the characteristic of low pressure.

However, in the ICP type, it is difficult to obtain a uniform plasma density because a potential difference exists between both an RF power application terminal and the ground terminal for the outflow of electric current that are isolated.

In the ICP type, there is a disadvantage that if the antenna is installed within the chamber, arcing occurs because a strong electric potential is formed at a front end (a part to which RF is applied) of the antenna.

Also, in the ICP type, if the antenna is inserted into the chamber, serious contamination may occur because the antenna is formed of copper (Cu) to reduce impedance of the antenna.

In recent years, semiconductor wafers have been large-sized to 300 mm beyond 200 mm and are henceforth expected to be more large-sized to a diameter of 450 mm. So, plasma uniformity is of much importance. However, the ICP type has a limitation in achieving the large-sizing of diameter and also, has a difficulty in ensuring large-scale plasma uniformity despite the fact that the large scale plasma uniformity has to be more guaranteed for an LCD device than a semiconductor.

In order to overcome such drawbacks, the ICP type keeps a distance between the ESC and the ceramic vacuum plate wide. This leads to an increase of a stay time of a reaction gas injected into the chamber. The thus increasing stay time of the injected reaction gas causes an increase of an ionization rate of gas and thus formation of complex kinds of radicals compared to the CCP type. Thus, there is a disadvantage the ICP type does not conform to the recent semiconductor and LCD process having to control delicate radicals.

The ICP type can generate uniform plasma at a low pressure at which plasma diffusion works well compared to the CCP type, but there is a problem that the ICP type cannot generate uniform plasma at a high pressure of 100 mT to 10 T at which plasma diffusion works poor.

DISCLOSURE OF INVENTION

Technical Problem

An aspect of exemplary embodiments of the present invention is to address at least the problems and/or disadvantages and to provide at least the advantages described below. Accordingly, an aspect of exemplary embodiments of the present invention is to provide a plasma generating apparatus configured to install an antenna unit having a complex structure of a plate shape antenna and a coil shape antenna within a chamber, allow elevation and descending of an ESC, control capacitance between the ESC and the antenna unit, selectively form either an electric field or a magnetic field within the chamber, and control RF power efficiency maximization and transmission rates, thereby being capable of increasing a density of plasma compared to a conventional high-density plasma generating apparatus, generating uniform plasma in both conditions of narrow and wide gaps between the ESC and the antenna unit and even in both conditions of low and high pressures within the vacuum chamber at the time large-scale high-density plasma is formed, applying to a diversity of processes for a semiconductor, a Liquid Crystal Display (LCD), an Organic Light Emitting Diode (OLED), a solar cell, etc. and also applying to material processing using plasma such as etching, Chemical Vapor Deposition (CVD), plasma doping, and plasma cleaning.

Technical Solution

According to one aspect of exemplary embodiments of the present invention, provided is a plasma generating apparatus. The apparatus includes a vacuum chamber, an ElectroStatic Chuck (ESC), an antenna unit, an antenna cover, and a cover holder. The vacuum chamber has a hollow interior and is sealed at its top by a vacuum plate that has a through-hole at its center. The ESC is disposed at an internal center of the vacuum chamber, receives an external bias Radio Frequency (RF), and places a substrate thereon. The antenna unit is disposed within the vacuum chamber under the vacuum plate. The antenna cover covers and is coupled to a top of the antenna unit, is exposed to the exterior through the through-hole of the vacuum plate, has a gas inlet at its outer periphery, and receives and forwards an external source RF to the antenna unit. The cover holder is caught by an upper surface of the vacuum plate with being coupled with the antenna cover, and suspends and holds the antenna unit.

The ESC may elevate and descend using a predetermined elevator while controlling capacitance with the antenna unit.

The elevator may be a bellows tube extending from a bottom surface of the ESC to a bottom surface of the vacuum chamber.

The bias RF may include a bias low-frequency RF and a bias high-frequency RF, separately.

The antenna unit may have a coupling structure of a plate shape antenna and a coil shape antenna. The plate shape antenna may generate plasma by capacitive coupling that forms an electric field with the ESC. The coil shape antenna may generate plasma by inductive coupling that applies a magnetic field and forms an inductive electric field within the vacuum chamber.

The antenna unit may be of a shape providing the plate shape antenna at a center of the antenna unit and extending the coil shape antenna from an outer periphery of the plate shape antenna.

The plate shape antenna may be of a disc shape. The coil shape antenna may include a first straight-line part, a circular arc part, and a second straight-line part. The first straight-line part radially extends from the outer periphery of the plate shape antenna. The circular arc part curves and extends from an end of the first straight-line part as drawing the same concentric arc as that of the plate shape antenna. The second straight-line part radially extends from an end of the circular arc part.

The antenna unit may be of a single structure extending a single coil shape antenna from the outer periphery of the plate shape antenna.

The antenna unit may be of a complex structure extending a plurality of coil shape antennas from the outer periphery of the plate shape antenna.

The antenna unit may include a concave part concaved downward at a center of the antenna unit and a plurality of gas jet ports formed in a penetration fashion at a bottom surface of the concave part.

The antenna unit may further include a gas diffusion plate between the concave part and the antenna cover.

The plate shape antenna may be of a rectangular plate shape. The coil shape antenna may be of a multistage-bent straight-line shape extending in a vertical direction from the outer periphery of the plate shape antenna, again extending from an end of the vertical extension in parallel with the plate shape antenna, and again vertically extending outward from an end of the parallel extension.

A component ratio of Capacitively Coupled Plasma (CCP) to Inductively Coupled Plasma (ICP) may be controllable by varying impedance ($Z_{ch}$) of the vacuum chamber and impedance ($Z_{coil}$) of the coil shape antenna.

The impedance ($Z_{ch}$) of the vacuum chamber may be expressed by Equation below:

$$Z_{ch} = 1/w\, CH_{ch}$$

where $Z_{ch}$: impedance of vacuum chamber, $C_{ch}$: capacitance of vacuum chamber, and w: frequency.

The capacitance ($C_{ch}$) of the vacuum chamber may be expressed by Equation below:

$$C_{ch} = \in (A/d_{gap})$$

where $\in$: dielectric constant within vacuum chamber,

A: area of plate shape antenna, and $d_{gap}$: distance of gap between plate shape antenna and ESC.

When the distance ($d_{gap}$) decreases, a CCP component ratio can increase by an increase of the capacitance ($C_{ch}$) and a decrease of the impedance ($Z_{ch}$).

The impedance ($Z_{coil}$) of the coil shape antenna may be expressed by Equation below:

$$Z_{coil} = R + jwL + 1/jwC$$

where j: imaginary unit ($j^2 = -1$), w: frequency,

L: inductance, and

C: capacitance.

The capacitance (C) may be expressed by Equation below:

$$C = \in (S/d)$$

where $\in$: dielectric constant of dielectric,

S: area of dielectric, and d: thickness of dielectric.

The vacuum chamber may be configured to divide a wall body, which forms a frame of the vacuum chamber, into upper and lower parts in a predetermined position and control capacitance between the ESC and the antenna unit. The vacuum chamber may further include a gap block airtightly interposed between the divided wall bodies.

The vacuum chamber may have a short up/down length as a narrow gap to provide a high capacitance between the ESC and the antenna unit.

The vacuum chamber may have a long up/down length as a wide gap to provide a low capacitance between the ESC and the antenna unit.

An area ratio of plate shape antenna to substrate may be equal to or more than 1/25.

An area ratio of both plate shape antenna and coil shape antenna to substrate may be equal to or more than 1/25.

The apparatus may further include an impedance controller provided in a predetermined part of the coil shape antenna.

The impedance controller may include an isolation part, a resonance circuit, and a protection box. The isolation part isolates cut surfaces of the coil shape antenna, which are obtained by cutting away a predetermined part of the coil shape antenna by a predetermined length, from each other at regular intervals. The resonance circuit connects with each of the cut surfaces of the coil shape antenna that are isolated from each other by the isolation part. The protection box protects the resonance circuit.

An insulating member may be interposed between the coil shape antenna and the protection box.

The resonance circuit may be a parallel resonance circuit.

The resonance circuit may be a series resonance circuit.

The resonance circuit may be a parallel variable resonance circuit.

The resonance circuit may be a series variable resonance circuit.

A concave groove part may be formed at an inner wall surface of the vacuum chamber. A front end of the second straight-line part of the coil shape antenna may be inserted into the concave groove part and be coupled and fixed to the inner wall surface of the vacuum chamber with a predetermined coupler.

The apparatus may further include a capacitor at a front end of the second straight-line part of the coil shape antenna.

The capacitor may be formed by interposing a dielectric between the front end of the second straight-line part and a concave groove part of the vacuum chamber.

The antenna unit may be formed of materials of a conductor comprising an insulating film or a coating layer having a resistance to plasma.

The insulating film may be aluminum (Al) anodized.

The insulating film may be formed by coating an insulator of ceramic, yttria ($Y_2O_3$), and zirconia ($ZrO_2$).

A method for coating the insulator of ceramic, yttria ($Y_2O_3$), and zirconia ($ZrO_2$) may be a thermal spraying method.

Advantageous Effects

As described above, a plasma generating apparatus has an effect that it is configured to install an antenna unit having a complex structure of a plate shape antenna and a coil shape antenna within a chamber, allow elevation and descending of an ElectroStatic Chuck (ESC), control capacitance between the ESC and the antenna unit, selectively form either an electric field or a magnetic field within the chamber, and control RF power efficiency maximization and transmission rates, thereby being capable of increasing a density of plasma compared to a conventional high-density plasma generating apparatus, generating uniform plasma in both conditions of narrow and wide gaps between the ESC and the antenna unit and even in both conditions of low and high pressures within the vacuum chamber at the time large-scale high-density plasma is formed, applying to a diversity of processes for a semiconductor, a Liquid Crystal Display (LCD), an Organic Light Emitting Diode (OLED), a solar cell, etc. and also applying to material processing using plasma such as etching, Chemical Vapor Deposition (CVD), plasma doping, and plasma cleaning.

BRIEF DESCRIPTION OF THE DRAWINGS

The accompanying drawings, which are included to aid in The above and other objects, features and advantages of the present invention will become more apparent from the following detailed description when taken in conjunction with the accompanying drawings in which:

FIG. 1 is a schematic diagram illustrating an example of a plasma generating apparatus according to the conventional art;

FIG. 2A is a schematic diagram illustrating another example of a plasma generating apparatus according to the conventional art;

FIG. 2B is a schematic plane diagram illustrating an ICP antenna of FIG. 2A;

FIG. 3 is a schematic cross section illustrating a plasma generating apparatus according to an exemplary embodiment of the present invention;

FIG. 4A is a schematic plane diagram illustrating an antenna unit of FIG. 3 within a chamber;

FIG. 4B is a cross section taken along line A-A' of FIG. 4A;

FIG. 5 is a schematic circuit diagram illustrating an equivalent circuit of a plasma generating apparatus according to an exemplary embodiment of the present invention;

FIGS. 6A to 6D are schematic plane diagrams illustrating antenna units of plasma generating apparatuses according to another exemplary embodiments of the present invention;

FIG. 7 is a schematic plane diagram illustrating an antenna unit of a plasma generating apparatus according to a further another exemplary embodiment of the present invention;

FIG. 8 is a schematic cross section illustrating a plasma generating apparatus according to a yet another exemplary embodiment of the present invention;

FIG. 9 is a schematic cross section illustrating a plasma generating apparatus according to a still another exemplary embodiment of the present invention;

FIG. 10 is a schematic cross section illustrating a plasma generating apparatus according to a still another exemplary embodiment of the present invention;

FIG. 11 is a schematic plane diagram illustrating a plasma generating apparatus in which an impedance controller is provided at a predetermined part of a coil shape antenna according to a still another exemplary embodiment of the present invention;

FIG. 12 is a schematic cross section illustrating a key element of FIG. 11;

FIG. 13 is a schematic diagram illustrating a parallel resonance circuit as a resonance circuit of FIG. 11;

FIG. 14 is a schematic diagram illustrating a series resonance circuit as a resonance circuit of FIG. 11;

FIG. 15 is a schematic diagram illustrating a parallel variable resonance circuit as a resonance circuit of FIG. 11;

FIG. 16 is a schematic diagram illustrating a series variable resonance circuit as a resonance circuit of FIGS. 11; and FIG. 17 is an equivalent circuit diagram illustrating the equivalent circuit of FIG. 5 and an impedance controller applied thereto.

Throughout the drawings, the same drawing reference numerals will be understood to refer to the same elements, features and structures.

MODE FOR THE INVENTION

Exemplary embodiments of the present invention will now be described in detail with reference to the annexed drawings. In the following description, a detailed description of known functions and configurations incorporated herein has been omitted for conciseness.

FIG. 3 is a schematic cross section illustrating a plasma generating apparatus according to an exemplary embodiment of the present invention. FIG. 4A is a schematic plane diagram illustrating an antenna unit of FIG. 3 within a chamber. FIG. 4B is a cross section taken along line A-A' of FIG. 4A. FIG. 5 is a schematic circuit diagram illustrating an equivalent circuit of a plasma generating apparatus according to an exemplary embodiment of the present invention.

As shown in FIGS. 3 to 5, the plasma generating apparatus includes a vacuum chamber 30, an ESC 34, an antenna unit 36, an antenna cover 37, and a cover holder 37b. The vacuum chamber 30 has a hollow interior and is sealed at its top by a vacuum plate 31 that has a through-hole 31a at its center. The ESC 34 is disposed at an internal center of the vacuum chamber 30, receives an external bias RF 32, and places a substrate 33 thereon. The antenna unit 36 is disposed within the vacuum chamber 30 under the vacuum plate 31. The antenna cover 37 covers and is coupled with a top of the antenna unit 36, is exposed to the exterior through the through-hole 31a of the vacuum plate 31, has a gas inlet 37a at its outer periphery, and receives and forwards an external source RF 35 to the antenna unit 36. The cover holder 37b is caught by a top surface of the vacuum plate 31 with being coupled with the antenna cover 37 and suspends and holds the antenna unit 36.

The vacuum chamber 30 is of a cylindrical shape having a hollow interior and opened at its top. The vacuum chamber 30 is sealed at its opened top by the vacuum plate 31 having the through-hole 31a at its center. The vacuum chamber 30 has a concave groove part 30a at its inner wall surface such that a front end of a second straight-line part 36b3 of a coil shape antenna 36b is inserted into and fixed to the concave groove part 30a.

A pumping port (not shown) is installed at a predetermined lower part of the vacuum chamber 30 and exhausts gas within the vacuum chamber 30.

The ESC (or a susceptor) 34 is of a plate shape being disposed at the internal center of the vacuum chamber 30, receiving an external bias RF 32, and placing the substrate 33 thereon. A bellows tube 38 is installed at a bottom of the ESC 34 and controls a gap between the ESC 34 and the antenna unit 36 during elevation and descent.

The bias RF 32 is configured to include a bias low-frequency RF 32a and a bias high-frequency RF 32b separately.

The antenna unit 36 is disposed within the vacuum chamber 30 under the vacuum plate 31 and receives the external source RF 35 via the antenna cover 37. In particular, the antenna unit 36 is of a structure coupling a plate shape antenna 36a with a coil shape antenna 36b. The plate shape antenna 36a generates plasma (P) by capacitive coupling that forms an electric field with the ESC 34. The coil shape antenna 36b generates plasma (P) by inductive coupling that applies a magnetic field and forms an inductive electric field within the vacuum chamber 30.

The antenna unit 36 is of a shape providing the plate shape antenna 36a at a center of the antenna unit 36 and extending the coil shape antenna 36b from an outer periphery of the plate shape antenna 36a such that an electric current induced by an RF power applied from a source can flow to the coil shape antenna 36b via the plate shape antenna 36a.

The plate shape antenna 36a is of a disc shape. The coil shape antenna 36b includes a first straight-line part 36b1, a circular arc part 36b2, and a second straight-line part 36b3. The first straight-line part 36b1 radially extends from the outer periphery of the plate shape antenna 36a. The circular arc part 36b2 curves and extends from an end of the first straight-line part 36b1 as drawing the same concentric arc as that of the plate shape antenna 36a. The second straight-line part 36b3 radially extends from an end of the circular arc part 36b2.

The front end of the second straight-line part 36b3 of the coil shape antenna 36b is inserted into the concave groove part 30a formed at the inner wall surface of the vacuum chamber 30 and is coupled and fixed to the inner wall surface of the vacuum chamber 30 with a predetermined coupler 36d.

A capacitor is further provided at the front end of the second straight-line part 36b3 of the coil shape antenna 36b. The capacitor is formed by interposing a dielectric 39 between the front end of the second straight-line part 36b3 and the concave groove part 30a of the vacuum chamber 30.

The antenna unit 36 is formed of materials of a conductor including an insulating film (that is, a coating layer) having a resistance to plasma.

The insulating film can be either aluminum (Al) anodized, or can be formed by coating an insulator such as ceramic, yttria ($Y_2O_3$), zirconia ($ZrO_2$), etc.

Desirably, a method for coating the insulator such as ceramic, yttria ($Y_2O_3$), zirconia ($ZrO_2$), etc. uses a thermal spraying method.

FIG. 6A shows that an antenna unit 46 is of a single structure extending a single coil shape antenna 46b from an outer periphery of a plate shape antenna 46a according to another exemplary embodiment of the present invention.

Further, as shown in FIGS. 6B to 6D, antenna units 56, 66, and 76 can have 'n'-point branch structures extending a plurality of coil shape antennas 56b, 66b, and 76b from outer peripheries of plate shape antennas 56a, 66a, and 76a.

The antenna unit 36 includes a concave part 36e and a plurality of gas jet ports 36f. The concave part 36e is concavely formed at a center of the antenna unit 36. The plurality of gas jet ports 36f are provided at a surface of the concave part 36e.

The antenna unit 36 further includes a gas diffusion plate 40 between the concave part 36e and the antenna cover 37.

FIG. 7 is a schematic plane diagram illustrating an antenna unit of a plasma generating apparatus according to a further another exemplary embodiment of the present invention.

As shown in FIG. 7, an antenna unit 86 includes a plate shape antenna 86a and a coil shape antenna 86b. The plate shape antenna 86a is of a rectangular plate shape. The coil shape antenna 86b is of a multistage-bent straight-line shape extending in a vertical direction from the outer periphery of the plate shape antenna 86a, again extending from an end of the vertical extension in parallel with the plate shape antenna 86a, and again vertically extending outward from an end of the parallel extension.

Such a rectangular substrate is applicable to various fields such as a Liquid Crystal Display (LCD), Organic Light Emitting Diode (OLED), and a solar cell.

It is desirable that an area ratio of plate shape antenna 36a, 46a, 56a, 66a, 76a, or 86a to substrate 33 is equal to or more than 1/25 in the present invention.

That is, the area ratio satisfies Formula 1 below:

$$S_p > (1/25)S_w \quad (1)$$

In Formula 1, 'Sp' denotes an area of the plate shape antenna and 'Sw' denotes an area of the substrate.

Alternately, it is also desirable that an area ratio of both plate shape antenna 36a, 46a, 56a, 66a, 76a, or 86a and coil shape antenna 36b, 46b, 56b, 66b, 76b, or 86b to substrate 33 is equal to or more than 1/25.

That is, the area ratio satisfies Formula 2 below:

$$S_p + _c > (1/25)S_w \quad (2)$$

In Formula 2, 'Sc' denotes an area of the coil shape antenna, 'Sp' denotes an area of the plate shape antenna, and 'Sw' denotes an area of the substrate.

The antenna cover 37 is of a shape covering the gas diffusion plate 40, being airtightly coupled to the top of the antenna unit 36, and having the gas inlet 37a at a predetermined part of its outer periphery.

The cover holder 37b holds the antenna cover 37. The cover holder 37b is put at its one end on an upper surface of the vacuum plate 31 and is coupled and fixed at the other end to the antenna cover 37 with a predetermined coupler 39.

Non-described reference numeral 41 denotes seals for keeping airtight between the vacuum plate 31 and the antenna cover 37 and between the vacuum plate 31 and the cover holder 37b.

In the above-constructed plasma generating apparatus, plasma (P) is generated within the vacuum chamber 30 by placing the substrate 33 on the ESC 34 within the vacuum chamber 30, controlling a gap between the antenna unit 36 and the ESC 34 using the bellows tube 38, applying each RF power 32 and 35 to the interior of the vacuum chamber 30 via each matcher 32c and 35a, injecting gas through the gas inlet 37a, and uniformly distributing the gas through the gas diffusion plate 40 and the gas jet ports 36f.

Of the bias RF 32, the bias low-frequency RF 32a ranges from about 100 KHz to 4 MHz and the bias high-frequency RF 32b ranges from about 4 MHz to 100 MHz.

Plasma (P) is generated if an electric field between the plate shape antenna 36a and the ESC 34 is formed (a CCP type). Plasma (P) is generated if a magnetic field between the coil shape antenna 36b and the ESC 34 is formed (an ICP type).

The CCP and ICP types each can be controlled in its component. Referring to the equivalent circuit of FIG. 5, expressions can be obtained in Equation 3 below:

$$Z_{ch}=1/w\ C_{ch}$$

$$C_{ch}= \in (A/d_{gap}) \quad (3)$$

In Equation 3, '$Z_{ch}$' is impedance of the vacuum chamber 30 and '$C_{ch}$' is capacitance of the vacuum chamber 30. The impedance ($Z_{ch}$) can be controlled by controlling the capacitance ($C_{ch}$).

'$\in$' denotes a dielectric constant of the interior of the vacuum chamber 30 and approximates to $\in_0$ at low pressure.

'A' represents an area of the plate shape antenna 36a and '$d_{gap}$' denotes a distance of a gap between the plate shape antenna 36a and the ESC 34. By controlling the distance ($d_{gap}$), a CCP component ratio can increase or decrease. If the distance ($d_{gap}$) decreases, the impedance ($Z_{ch}$) decreases and thus the CCP component ratio increases.

Inversely, if the distance ($d_{gap}$) increases, the impedance ($Z_{ch}$) increases and thus the CCP component ratio decreases.

In FIG. 5, impedance ($Z_{coil}$) of the coil shape antenna 36b can be expressed in Equation 4 below:

$$Z_{coil}=R+jwL+1/jwC \quad (4)$$

In Equation 4, 'j' is an imaginary unit ($j^2=-1$), 'w' is a frequency, 'L' is inductance, and 'C' is capacitance. The capacitance (C) can be expressed in Equation 5 below:

$$C=\in (S/d) \quad (5)$$

As such, the capacitor is formed by interposing the dielectric 39 between the coil shape antenna 36b and the vacuum chamber 30.

In Equation 5, '$\in$' is a dielectric constant of the dielectric 39, 'S' is an area of the dielectric 39, and 'd' is a thickness of the dielectric 39. The capacitance (C) can vary by controlling the thickness (d) of the dielectric 39.

The dielectric 39 can be materials such as Teflon, Vespel, Peek, ceramic, etc.

FIG. 8 is a schematic cross section illustrating a plasma generating apparatus according to a further another exemplary embodiment of the present invention.

As shown in FIG. 8, a vacuum chamber 301 is configured to divide a wall body 301a forming a frame of the vacuum chamber 301 into upper and lower parts in a predetermined position to control capacitance between an ESC 302 and an antenna unit 303. The vacuum chamber 301 can further include a gap block 304 airtightly interposed between the divided wall body 301a.

Either the gap block 304 can be controlled at a desired height or its height can be controlled using a plurality of gap blocks 304. Desirably, sealing members 305 are provided for sealing between the gap block 304 and the upper and lower wall bodies 301a, respectively.

FIG. 9 is a schematic cross section illustrating a plasma generating apparatus according to a yet another exemplary embodiment of the present invention.

As shown in FIG. 9, a vacuum chamber 311 can be of a structure having a short up/down length as a narrow gap to provide a high capacitance between an ESC 312 and an antenna unit 313.

The ESC 312 is configured as a fixed type not permitting its own elevation and descent within the vacuum chamber 311.

FIG. 10 is a schematic cross section illustrating a plasma generating apparatus according to a still another exemplary embodiment of the present invention.

As shown in FIG. 10, a vacuum chamber 321 can be of a structure having a long up/down length as a wide gap to provide a low capacitance between an ESC 322 and an antenna unit 323.

The ESC 322 is configured as a fixed type not permitting its own elevation and descent within the vacuum chamber 321.

When a reference distance for the narrow gap and the wide gap is 60 mm approximately, below 60 mm can be defined the narrow gap and over 60 mm can be defined the wide gap.

FIGS. 11 to 17 show that an impedance controller is additionally provided at a predetermined part of a coil shape antenna 36b according to a still another exemplary embodiment of the present invention.

The impedance controller includes an isolation part 105, a resonance circuit 111, 112, 113, or 114, and a protection box 110. The isolation part 105 is configured to isolate cut surfaces of the coil shape antenna 36b, which are obtained by cutting away a predetermined part of the coil shape antenna 36b by a predetermined length, from each other at regular intervals. The resonance circuit 111, 112, 113, or 114 connects with each of the cut surfaces of the coil shape antenna 36b that are isolated from each other by the isolation part 105. The protection box 110 protects the resonance circuit 111, 112, 113, or 114.

An insulating member 120 is interposed for insulation between the coil shape antenna 36b and the protection box 110.

On the right of the resonance circuit 111, 112, 113, or 114 in FIG. 12, the coil shape antenna 36b is earthed and therefore, does not require the insulation member 120. On the left, the coil shape antenna 36b is not earthed and therefore, requires the insulation member 120 surrounding its whole frame.

FIG. 13 shows a parallel resonance circuit as the resonance circuit 111. FIG. 14 shows a series resonance circuit as the resonance circuit 112.

FIGS. 15 and 16 show variable elements. In detail, FIG. 15 shows a parallel variable resonance circuit as the resonance circuit 113. FIG. 16 shows a series variable resonance circuit as the resonance circuit 114.

FIG. 17 is an equivalent circuit diagram illustrating the equivalent circuit of FIG. 5 and the impedance controller applied thereto.

While the invention has been shown and described with reference to a certain preferred embodiment thereof, it will be understood by those skilled in the art that various changes in form and details may be made therein without departing from the spirit and scope of the invention as defined by the appended claims.

The invention claimed is:

1. A plasma generating apparatus comprising:
a vacuum chamber having a hollow interior and sealed at its top by a vacuum plate that has a through-hole at its center;
an Electrostatic Chuck (ESC) disposed at an internal center of the vacuum chamber, receiving an external bias Radio Frequency (RF), and placing a substrate thereon; an antenna unit disposed within the vacuum chamber under the vacuum plate;
an antenna cover covering and coupled to a top of the antenna unit, exposed to the exterior through the through-hole of the vacuum plate, having a gas inlet at its outer periphery, and receiving and forwarding an external source RF to the antenna unit;
a cover holder caught by an upper surface of the vacuum plate with being coupled with the antenna cover, and suspending and holding the antenna unit, wherein the antenna unit has a coupling structure of a plate shape antenna and a coil shape antenna, wherein the plate shape antenna generates plasma by capacitive coupling that forms an electric field with the ESC, and wherein the coil shape antenna generates plasma by inductive coupling that applies a magnetic field and forms an inductive electric field within the vacuum chamber; and
an impedance controller provided in a predetermined part of the coil shape antenna, wherein the impedance controller comprises: an isolation part for isolating cut surfaces of the coil shape antenna, which are obtained by cutting away a predetermined part of the coil shape antenna by a predetermined length, from each other at regular intervals; a resonance circuit connecting with each of the cut surfaces of the coil shape antenna that are isolated from each other by the isolation part; and a protection box for protecting the resonance circuit.

2. The apparatus of claim 1, wherein the antenna unit is of a shape providing the plate shape antenna at a center of the antenna unit and extending the coil shape antenna from an outer periphery of the plate shape antenna.

3. The apparatus of claim 2, wherein the plate shape antenna is of a disc shape, and wherein the coil shape antenna comprises: a first straight-line part radially extending from the outer periphery of the plate shape antenna; a circular arc part curving and extending from an end of the first straight-line part as drawing the same concentric arc as that of the plate shape antenna; and a second straight- line part radially extending from an end of the circular arc part.

4. The apparatus of claim 2, wherein the antenna unit is of a single structure extending a single coil shape antenna from the outer periphery of the plate shape antenna.

5. The apparatus of claim 3, wherein a concave groove part is formed at an inner wall surface of the vacuum chamber, and wherein a front end of the second straight -line part of the coil shape antenna is inserted into the concave groove part and is coupled and fixed to the inner wall surface of the vacuum chamber with a predetermined coupler.

6. The apparatus of claim 3, further comprising: a capacitor at a front end of the second straight- line part of the coil shape antenna.

7. The apparatus of claim 6, wherein the capacitor is formed by interposing a dielectric between the front end of the second straight-line part and a concave groove part of the vacuum chamber.

8. The apparatus of claim 1, wherein the antenna unit is formed of materials of a conductor comprising an insulating film or a coating layer having a resistance to plasma.

* * * * *